United States Patent [19]

Kinoshita et al.

[11] Patent Number: 4,527,199
[45] Date of Patent: Jul. 2, 1985

[54] SOLID STATE IMAGE PICK-UP DEVICE

[75] Inventors: Takao Kinoshita, Tokyo; Tokuichi Tsunekawa; Yuichi Sato, both of Kanagawa, all of Japan

[73] Assignee: Canon Kabushiki Kaisha, Tokyo, Japan

[21] Appl. No.: 353,568

[22] Filed: Mar. 1, 1982

[30] Foreign Application Priority Data

Mar. 9, 1981 [JP]   Japan ................................. 56-33558

[51] Int. Cl.$^3$ .......................... H04N 3/14; H04N 5/30
[52] U.S. Cl. ........................................ 358/213; 357/24
[58] Field of Search .......................... 358/213, 241, 37; 357/24, 24 LR, 30 C

[56] References Cited

U.S. PATENT DOCUMENTS

| 4,264,930 | 4/1981 | White | 358/213 |
|---|---|---|---|
| 4,302,779 | 11/1981 | Inoue | 358/213 |
| 4,336,557 | 6/1982 | Koch | 358/213 |
| 4,375,597 | 3/1983 | Kosonocky | 357/24 LR |

Primary Examiner—Tommy P. Chin
Attorney, Agent, or Firm—Toren, McGeady, Stanger, Goldberg & Kiel

[57] ABSTRACT

In the device disclosed, a plurality of light receiving elements each form an electric charge corresponding to the amount of light incident thereon, and a divider divides the charge generated at each of the light receiving elements into a number of parts and thereafter adds the charge parts divided according to a predetermined pattern. According to an embodiment, one divided charge part of one element is added to the charge part of an adjacent element to form an interpolation value.

13 Claims, 8 Drawing Figures

SOLID STATE IMAGE PICK-UP DEVICE

BACKGROUND OF THE INVENTION

1. Field of the Invention

The present invention relates to a solid state image pickup element, and particularly to an interpolation technique for improving the pseudo resolving power of the element.

2. Description of the Prior Art

For example, the resolving power of an object image formed at a one-dimensional line image pickup device having electric charge accumulation and conversion elements, such as C.C.D's (charge coupled device) and B.B.D's (bucket brigade devices) and an electric charge transfer arrangement is determined by the number of light receiving elements forming the image pickup line or plane. Means for obtaining a high resolving power artificially with a limited number of light receiving elements, particularly by employing an interpolation between outputs of light receiving elements (picture elements) are known. For example, a device described in U.S. Pat. No. 4,148,059 performs interpolation of picture element outputs by providing a circuit with a memory element for memorizing picture element outputs, a delay element, a differential amplifier and an integration circuit, etc. at a part other than the image pickup element. This device has the shortcoming that these constituent elements are of a large scale. Thus, it is difficult to mount them within the same tip with a solid state image pickup element.

SUMMARY OF THE INVENTION

An object of the present invention is to provide a solid state image pick-up element which can eliminate the above-mentioned shortcoming of a conventional device.

Also another object of the present invention is to provide a solid state image pick-up element in which interpolation signals can be obtained by a limited number of picture elements and a simple arrangement.

Further another object of the present invention is to provide a solid state image pick-up element which can be easily formed into one tip and has a high resolving power.

According to an example of the present invention, a plurality of light receiving parts, a transfer path to consecutively transfer an electric charge photo-electrically accumulated at said light receiving parts, an accumulation part which is provided in said path to temporarily accumulate the electric charge consecutively transferred, and an addition means to divide said electric charge at the accumulation part and add the same up with a prescribed combination, are provided on a semi-conductor substrate.

Therefore, not only signals corresponding to each light receiving part (picture element) can be obtained but pseudo signals to supplement devoid portions between adjacent picture elements can also be obtained. This permits the resolving power to be substantially improved.

Also according to an example of the present invention, a gate means is provided to divide the electric charge within the accumulation position and add the same, and an amount of transferred charge at a prescribed timing out of the accumulated electric charge is controlled by said gate means, so a division of electric charge can be performed by a simple structure.

Also, because the division and addition means for dividing an electric shape is within the electric shape transfer path, electric charges being transferred in time series can be consecutively divided and added. Therefore, the division and addition means do not have to be provided in large numbers, and a minimum number of the same can suffice. Also, as interpolation signals are produced at an electric charge stage, interpolation signals can be easily formed by pulses outside of the image pick-up element.

BRIEF DESCRIPTION OF THE DRAWINGS

FIGS. 2(1) to 2(5) are schematic diagrams of potentials at the electrodes in FIG. 2(0), and FIG. 2(6) is a structural cross sectional view at an output state at an electric charge transfer part of the element shown in FIG. 1.

DETAILED DESCRIPTION OF THE PREFERRED EMBODIMENTS

While the present invention applies to various types of sensors, including one dimensional line sensors, and two-dimensional area sensors, etc., the following explanation is directed to a line sensor for simplicity.

Figure 1:
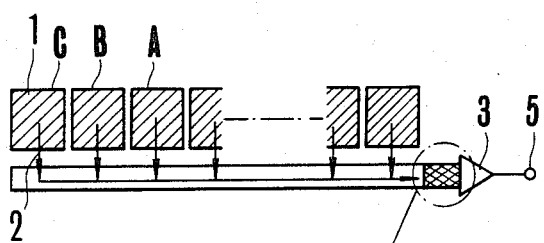
FIG. 1 is a schematic diagram showing an example of a solid state image pick-up element according to the present invention.

In FIG. 1, electric charge conversion or picture elements collectively identified as 1 and individually as A, B, C, etc. have their electric charges simultaneously transferred to an electric charge transfer portion 2, such as a transfer path, by shift pulses, and are consecutively transferred to an output stage by transfer pulses. An output representing a video image thus transferred is converted into voltage signals at an electric charge-voltage conversion part 3 which converts a charge volume to a voltage level, and is taken out of the device from an output terminal 5. While what is shown above is an arrangement of a known type of a C.C.D. line sensor, the device of the present invention has an output stage shown by a circle mark in the drawing made as shown in FIG. 2 as an example.

Figure 2:
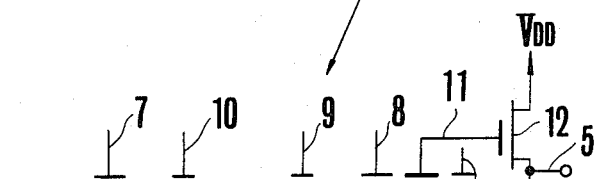
FIG. 2(0) is a schematic diagram of electrode elements at the output of an image pickup device embodying the invention, with the electrodes acting as gates within the device.
Figure 2:
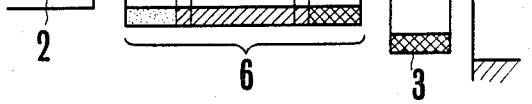
Figure 2:
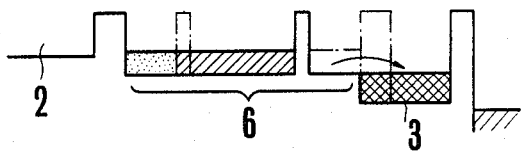
Figure 2:
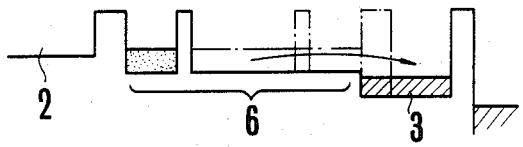
Figure 2:
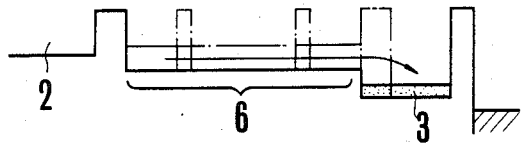
Figure 2:
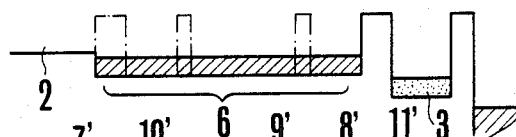
Figure 2:
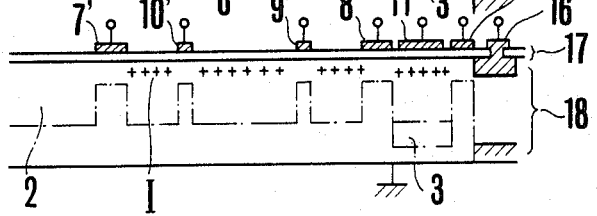

That is, what is shown as 2 in FIG. 2 is an electric charge transfer part consisting of C.C.D., etc., and is equivalent to a horizontal shift transistor, etc. when an image pick-up element is a two-dimensional sensor, as an example. What is shown as 3 is an output charge-voltage conversion part, and in this example a signal charge accumulation part 6 is provided between said electric charge transfer part 2 and the conversion part 3. What is shown as 7 is a gate to transfer signal charge from the transfer part 2 to the accumulation part 6, and what is shown 8 is a gate to transfer the signal charge from the accumulation portion 6 to the charge-voltage conversion portion 3, while gates 9 and 10 identified only by their electrodes partially form potential barriers at the signal charge accumulation portion. Here the ratio of signal charge spaces partitioned by the barriers at electrodes 9 and 10 in the example shown in the drawing is set at 1:2:1. A clear gate 15 identified only by its electrode serves to clear the electric charge at the conversion portion 3. A portion 18 is for example a silicon substrate, and an insulating layer 17 is composed, as an example, of silicon dioxide. Members 7' to 11', 15' are electrodes respectively corresponding to the electrodes of gates 7 to 11, 15. A drain electrode 16 forms a drain to pour in the electric charge exhausted out of the clear gate 15. The material for these electrodes, are aluminium or polysilicon, etc. for example. as I are implanted ions such as phosphorus (P+) or arsenic (As+) implanted on the silicon substrate 18.

Since such arrangement is employed potential wells as shown in FIGS. 2(1) to (5) are formed beforehand on the silicon substrate, and a barrier between each potential well is removed by adding plus potential to each electrode. Also, 11 is a floating gate and 12 is MOF FET (field effect transistor) while 14 is a resistor, and what is shown as 5 is an output terminal, thus a source follower circuit as an electric charge voltage conversion circuit is formed by these elements.

Now a driving method of a solid state image pickup element of the present invention shall be explained along the potential diagrams of FIGS. 2(1) to (5).

As shown in FIG. 2(1), after the signal charge of one picture element formed at a picture element B of FIG. 1 as an example is taken into the accumulation part 6 from the electric charge transfer part 2, said electric charge is accumulated at the accumulation part 6 by closing the gate 7. At this time one fourth ($\frac{1}{4}$) of an amount of the signal charge of a time sequentially immediately preceding picture element that is as an example a picture element A of FIG. 1 remains at the electric charge-voltage conversion part 3 as will be explained later. Then by opening the gate 8 after closing the gate 9 as shown in FIG. 2(2), $\frac{1}{4}$ of the electric charge at the picture element B within the accumulation part 6 and $\frac{1}{4}$ of the electric charge of the picture element A remaining at the conversion part 3 are added together. After that the gate 8 is once closed to output the signal voltage at the output terminal 5. This signal voltage is equivalent to an interpolation signal between the picture elements A and B as it becomes a mixed signal of the electric charges at the picture elements A and B.

Next, as shown in FIG. 2(3) the gate 10 is closed and at the same time the clear gate 15 is opened for a short period of time to clear the electric charge at the conversion part, then the gates 9, 10 are opened to take in $\frac{1}{2}$ of the signal charge at the electric charge accumulation part 6 into the electric charge-voltage conversion part 3. After that the gate 8 is closed again, then the signal voltage corresponding to the picture element B is output.

Next, after the clear gate 15 is opened for a short period of time to clear the electric charge again the gates 8, 10 are opened as shown in FIG. 2(4) to transfer the remaining electric charge ($\frac{1}{4}$) of the picture element B to the conversion part 3. Then the gate 8 is closed and at the same time the gate 7 is opened as shown in FIG. 2(5) to transfer the electric charge corresponding to a next picture element C to the accumulation part 6. After that the state of FIG. 2(1) is resumed by closing the gate 7, thus the above-mentioned procedured is repeated.

Also while the explanations have been made by using a line sensor structure as an example, the present invention can naturally be applied to a two-dimensional sensor structure. In that case, as an electric charge transfer path at which the electric charge accumulation means according to the present invention is provided may be, for example, near an end terminal of the horizontal shift resistor at the image pick-up element. In this case also the electric charge accumulation means could be only one. Also a position at which said electric charge accumulation means is provided may be between a light receiving zone and an accumulation zone at a frame transfer type image pick-up element. Also, it could be between said accumulation zone and a horizontal shift resistor. Further it may be between a vertical shift resistor and a horizontal shift resistor at an interline transfer type image pick-up element.

Also, when the electric charge accumulation means of the present invention is provided at the aforementioned positions, the number of said means equal to the number of picture elements in the horizontal direction will be needed.

While an interpolation signal is formed by securing a correlation between two adjacent picture elements in the above example, larger numbers of picture element outputs other than the above may be mixed according to other embodiments of the invention.

It is possible to expand the principle of the abovementioned structure and vary the number of the abovementioned retaining portion divided, and the dividing ratios, so that the number of interpolation picture elements is increased and the interpolation effect is varied.

Further, while an output stage charge-voltage conversion portion is used to perform an addition of electric charges, an independent portion to solely serving such may be provided separately, or the addition may be performed at each address of another shift resistor.

As has been explained above in detail, the present invention serves to provide an electric charge accumulation portion which can accumulate a signal charge for one picture element at a part of a solid state image pick-up element, and at the same time to provide an addition means which divides and adds the electric shape accumulated at the electric charge accumulation portion. Hence, an interpolation picture element output between each picture element can be obtained, and the pseudo resolving power can be improved thereby. Thus, an effect, the same as or better than that of the conventional method can be obtained without using a complicated circuit arrangement such as in the conventional structure. Also, such a device can be provided within a single tip as an image pick-up element so that the scale of an image pick-up device employing the same can be made small. This greatly reduces the size and a weight of the device.

What is claimed is:

1. A method for transferring an electric charge, comprising:
   (a) a step of storing the electrical charge in a first portion;
   (b) a step of forming a potential barrier in the first portion to divide the electric charge in the first portion;
   (c) a step of introducing and storing the divided electric charge to a second portion in a prescribed repeating cycle; and
   (d) a step of introducing the divided electric charge stored in the second portion to a third portion in a cycle different from the prescribed repeating cycle for the introduction to the second portion.

2. A method according to claim 1, in which the step of introducing the divided electric charge stored in the second portion includes introducing the divided electric charge to a drain.

3. A method according to claim 1, in which the divided electric charge stored in the second portion is converted into a voltage.

4. A device for transferring an electric charge, comprising:
   (a) a first portion for storing the electric charge;
   (b) electrode means for forming a barrier to divide the electric charge in the first portion;
   (c) a second portion for storing, in a prescribed repeating cycle, the electric charge divided by the electrode means; and
   (d) a third portion for receiving the electric charge of the second portion in a cycle different from the prescribed repeating cycle.

5. A device according to claim 4, in which the third portion includes a drain.

6. A device according to claim 4, which further comprises means for converting the electric charge stored in the second portion into a voltage.

7. A device according to claim 4, in which the electrode means is arranged to divide the electric charge in the first portion into three portions.

8. A device according to claim 7, in which the electrode means is arranged to divide the amounts of the three divided electric charges in proportions of 1:2:1.

9. A solid state image pickup device comprising:
   (a) a plurality of light receiving means each forming a signal electric charge corresponding to an amount of light respectively incident thereon;
   (b) a transfer portion for transferring electric charges of the plurality of light receiving means;
   (c) a first portion in the transfer portion, for storing the transferred electric charges;
   (d) electrode means for forming a barrier to divide the transferred electric charges in the first portion;
   (e) a second portion for storing, in a prescribed repeating cycle, the transferred electric charges divided by the electrode means; and
   (f) a third portion for receiving the divided electric charge of the second portion in a cycle different from the prescribed cycle.

10. A solid state image pickup device according to claim 9, in which the third portion includes a drain.

11. A solid state image pickup device according to claim 9, which further comprises means for converting the electric charge stored in the second portion into a voltage.

12. A solid state image pickup device according to claim 9, in which the electrode means is arranged to divide the electric charge in the first portion into three portions.

13. A solid state image pickup device according to claim 12, in which the electrode means are arranged to divide the amounts of the three divided electric charges in proportion of 1:2:1.

* * * * *